(12) United States Patent
Lee

(10) Patent No.: US 6,440,865 B1
(45) Date of Patent: Aug. 27, 2002

(54) METHOD OF PROFILE CONTROL IN METAL ETCHING

(75) Inventor: Szetsen Steven Lee, Taipei (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/575,563

(22) Filed: May 22, 2000

(30) Foreign Application Priority Data

Mar. 15, 2000 (TW) ........................................ 89104705 A

(51) Int. Cl.$^7$ ............................................. H01L 21/302
(52) U.S. Cl. ...................... 438/714; 438/720; 438/736; 438/734; 438/738; 216/72; 216/75
(58) Field of Search ................................. 438/714, 720, 438/736, 734, 738; 216/75, 72

(56) References Cited

U.S. PATENT DOCUMENTS

| | | | |
|---|---|---|---|
| 5,350,488 A | * 9/1994 | Webb .......................... | 156/643 |
| 5,858,879 A | * 1/1999 | Chao et al. ................. | 438/725 |
| 5,952,244 A | * 9/1999 | Abraham et al. ........... | 438/714 |
| 5,976,986 A | * 11/1999 | Naeem et al. ............... | 438/714 |
| 6,303,510 B1 | * 10/2001 | Chien et al. ................ | 438/710 |
| 6,309,979 B1 | * 10/2001 | Patrick et al. .............. | 438/714 |

FOREIGN PATENT DOCUMENTS

| | | | |
|---|---|---|---|
| JP | 09-232284 | * | 9/1997 |
| JP | 09-251984 | * | 9/1997 |

* cited by examiner

*Primary Examiner*—George Goudreau
(74) *Attorney, Agent, or Firm*—Darby & Darby

(57) ABSTRACT

A method of profile control in metal etching, wherein a metal layer is positioned on a dielectric layer comprising an aluminum-alloy layer on the dielectric and an anti-reflection layer on the aluminum-alloy layer. The method of the present invention includes a step of performing a break-through step of a first etch recipe to remove the anti-reflection layer and a certain thickness of the aluminum-alloy layer until a predetermined depth is reached. The method then further includes a step of performing a main etch step of a second etch recipe having a higher etch rate than the first etch recipe to remove the remaining residue of the aluminum-alloy layer. The main object of the present invention is to achieve formations of metal lines with smooth and tapered sidewalls. Thereby, the method of the present invention reduces the possibility of forming voids during the subsequent deposition process, which improves the reliability of the IC devices made.

19 Claims, 3 Drawing Sheets

METHOD OF PROFILE CONTROL IN METAL ETCHING

BACKGROUND OF THE INVENTION

1. Field of the Invention

The present invention generally relates to a method of profile control in metal etching. More specifically, the present invention relates to a method of profile control for etching a metal layer with an anti-reflection layer.

2. Description of the Related Art

In a typical metal-etching process, the overhang (or "I"-shape) profile has long been a serious problem, as shown in FIG. 1. Among many disadvantages, voids 20 or empty gaps are often found when depositing dielectric material 18 during the subsequent process to fill between metal lines, as shown in FIG. 2. The incomplete filling can cause possible reliability problems in the IC devices made.

A typical metal layer stacked in semiconductor devices consists of TiN/AlSiCu/TiN/Ti. The overhang (top of "I") is formed because TiN 10 is harder to etch than AlSiCu 12 (mostly Al). Moreover, the bowing at the sidewalls of AlSiCu 12 usually indicates (i) sidewall passivation occurred during the etching process is not enough and (ii) ion bombard is too strong, which knocks off the polymer for sidewall passivation.

Increasing the sidewall passivation can decrease the etch rate at sidewalls and thus forms a tapered metal profile. Such a profile can make the step coverage of the subsequent dielectric material more conformal, less build-up at the top corners of the metal lines, and less void size. In order to protect the Al profile by providing sufficient sidewall passivation, a method that can increase the bias power of the metal etcher is employed. Most of the advanced metal etchers are equipped with separate power sources: top/source power (TP) and bottom/bias power (BP). Roughly speaking, TP pertains to the ion density of plasma to control the isotropic etch rate, and BP pertains to the energy of ion bombard to control the anisotropic etch rate. To provide sufficient sidewall passivation for protecting ALCuSi 12, the bias power BP of the etcher can be increased to bombard photoresist (PR) to form carbonaceous polymers for sidewall passivation. However, it can cause serious loss of PR, which causes metal cutting and is impractical. It is believed that nitrogen ($N_2$) can help forming byproducts, such as BxNy and AlxNy, to protect the sidewalls of the metal layer. However, if [$N_2$] (the flow rate of $N_2$) is too high, it may be difficult to sustain plasma that discharges unstably.

Due to the significant etch rate (ER) difference between TiN and AlSiCu, different etch recipes (i.e. different ER) are used. However, it is often found that there is always a "discontinuity" occurring at the interface of TiN/AlSiCu. Results are profile (slope) change and "I"-shape formation. In the worst case, when etching Al, the originally profile-fixed TiN layer is also affected. Most of all, the "I"-shape-free profile is still difficult to maintain with conventional methods.

SUMMARY OF THE INVENTION

Therefore, an object of the present invention is to provide a method of profile control for etching a metal layer. The profile of the metal line generated by the present invention has slightly tapered sidewalls, which are formed without "I"-shaped metal profile. The voids that may be generated by the subsequent deposition process, therefore, are lessened or disappeared.

The present invention achieves the above-indicated objects by providing a method of profile control for etching a metal layer. The metal layer is positioned on a dielectric layer comprising an aluminum-alloy layer on the dielectric and an anti-reflection layer on the aluminum-alloy layer. The method includes performing a breakthrough step of a first etch recipe to remove the anti-reflection layer and a certain thickness of the aluminum-alloy layer until a predetermined depth is reached. The first etch recipe provides a first source power, a first bias power, and nitrogen as one of the reactive gases. The ratio between the first source power and the first bias power is around 1/3. The method further comprises performing a main etch step of a second etch recipe that has a higher etch rate than the first etch recipe for removing the remaining residue of the metal layer. The second etch recipe provides a second source power, a second bias power, and nitrogen as one of the reactive gases. The ratio between the second source power and the second bias power is about 10/3.

The major advantage of the present invention is that the formation of metal lines with smooth and tapered sidewalls (i.e. "I"-shape-free metal profile) can reduce the possibility of forming voids during the subsequent deposition process and thereby improve the reliability of the IC devices made.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1:
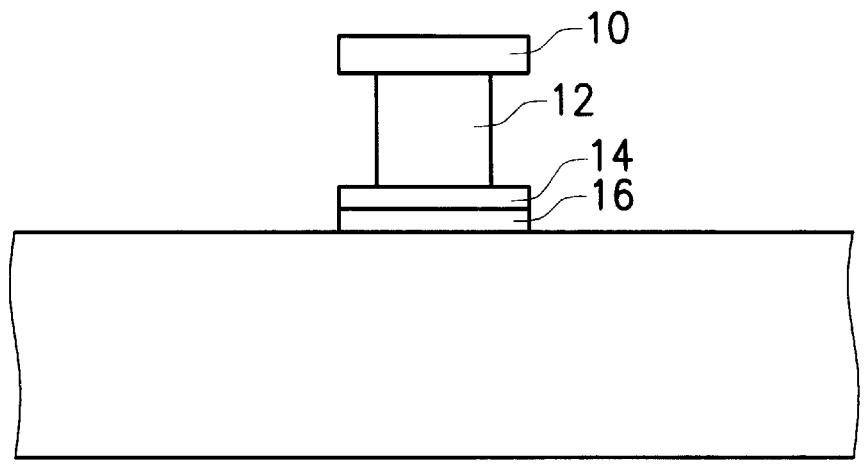
FIG. 1 illustrates the "I"-shape metal profile of a metal line generated due to a conventional metal etch recipe.
Figure 2:
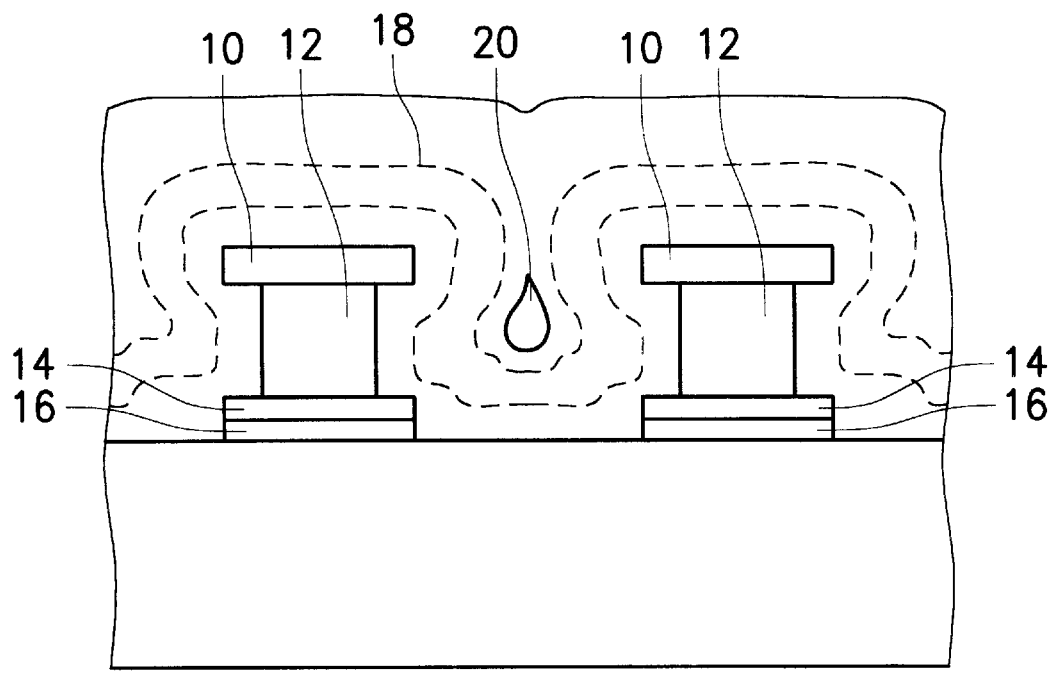
FIG. 2 depicts the formation of a void on the wafer in FIG. 1.
Figure 3:
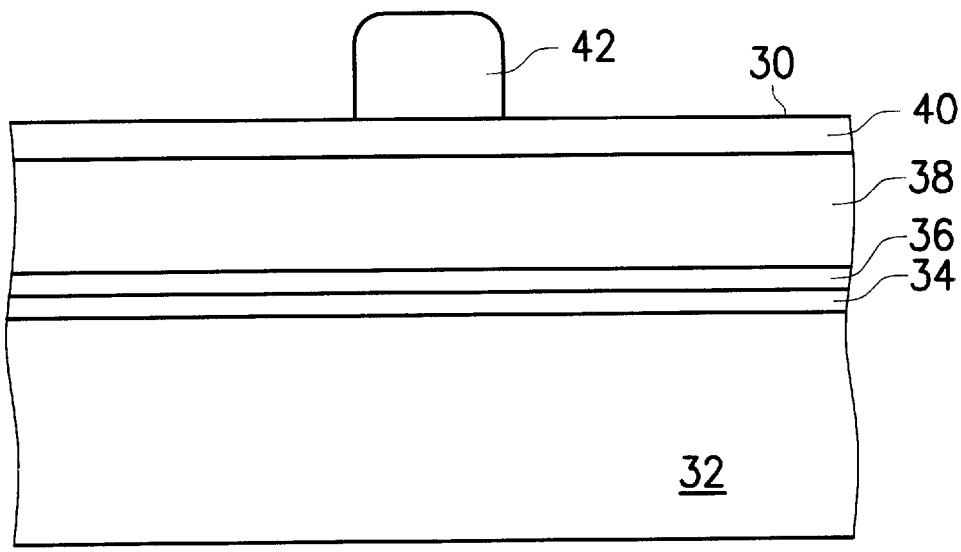
FIG. 3 shows a semiconductor wafer that is to be applied with the method of the present invention.

The present invention provides a method of profile control for etching a metal layer 30. The metal layer 30, as shown in FIG. 3, is positioned on a dielectric layer 32, and is comprised of an adhesion layer 34, a shielding layer 36, an aluminum-alloy layer, and an anti-reflection layer 40, which are stacked from bottom to top. For example, the adhesion layer 34 is made of Ti for enhancing the subsequent adhesive bonding of metal layers on the semiconductor wafer. The shielding layer 36 is made of TiN to prevent the adhesion layer 34 and the aluminum-alloy layer 38 from interacting with each other, thus the sheet resistance of the metal layer 30 can be kept under a reasonable level. The aluminum-alloy layer 38 is an alloy comprised of Al, Si, and Cu, which acts as a major conductive layer. The anti-reflection layer 40 is made of TiN for lessening the light reflection during the subsequent lithography process and for enhancing the pattern resolution of the lithography process. Furthermore, a developed photoresist layer 42 is usually formed on the metal layer 30 to define the area to be etched in order to pattern the metal layer 30 before proceeding with the method of the present invention.

The essence of the present invention is in that, two etch recipes, each with a different etch rate (ER), are used in combination to etch the aforementioned metal layer 30. In the first etch recipe, a breakthrough step with a low ER is performed to remove the anti-reflection layer 40 and a certain thickness of the aluminum-alloy layer 38 until a predetermined depth is reached to form smooth and tapered sidewalls. Concurrently, the breakthrough step also provides sufficient passivation to the sidewalls. Then, a main etch step with a high ER, of the second etch recipe, is performed along the smoothly tapered sidewalls to remove the remaining residue of the metal layer 30 and accomplish the patterning of the metal layer 30 thereby.

Referring to table 1, table 1 describes the content of the etch program according to the method of the present invention.

TABLE 1

| Step | TP/BP | [$Cl_2$] : [$BCl_3$] | [$N_2$] | Note |
|---|---|---|---|---|
| Breakthrough | 1:3 | 1:1 | 20 sccm | Low ER, Stops at ⅓ of the aluminum-alloy layer. |
| Main etch | 10:3 | 5:1 | 20 sccm | High ER, Starts at ⅓ the aluminum-alloy layer |

Hereinafter, TP and BP denote the values of the top power (source power) and the bottom power (bias power), respectively, and [x] denotes the flow rate of a gas x.

The proposed conditions for the breakthrough step are as such: the ratio between TP and BP is around 1/3; the ratio between [$Cl_2$] and [$BCl_3$] is around 1; and [$N_2$] is around 20 sccm, as shown in table 1. The suggested [$N_2$] value is 10 sccm or above so that tapered sidewalls can be obtained. Nonetheless, the [$N_2$] cannot be so high as to interrupt the formation of plasma. The above conditions altogether comprise the first etch recipe of a low etch rate involving a breaking-through step in contrast to the second etch recipe of a high etch rate that includes the main etch step. To avoid a "discontinuity" occurring at the interface of TiN/AlSiCu, the breakthrough step etches beyond the anti-reflection layer 40 and stops at a predetermined depth of the aluminum-alloy layer 38; for instance, ⅓ of the thickness of the aluminum-alloy layer 38. Besides the smooth and continuous sidewalls around the interface of the anti-reflection layer 40 and the aluminum-alloy layer 38, the breakthrough step also provides sufficient passivation to the sidewalls.

The proposed conditions for the main etch step are as such: the ratio between TP and BP is around 10/3; the ratio between [$Cl_2$] and [$BCl_3$] is around 5:1; and [$N_2$] is around 20 sccm, as shown in table 1. As mentioned before, the suggested [N2] value is 10 sccm or above so that tapered sidewalls can be obtained but not so high as to interrupt the formation of plasma. These conditions altogether comprise the second recipe of a high etch rate to remove the remaining residue of the metal layer 30 along the pre-fabricated sidewalls and thereby accomplish the patterning of the metal layer 30.

Accordingly, the ratio between TP and BP in the breakthrough step (=1:3) is smaller than the ratio between TP and BP in the main etch step (=10:3). Therefore, the ion bombardment performed during the breakthrough step is more violent than the ion bombardment performed during the main etch step so that part of the photoresist layer 42 is kicked off to form carbonaceous polymer on the sidewalls as a heavy passivation film. The ratio between [$Cl_2$] and [$BCl_3$] in the breakthrough step (=1:1) is smaller than the ratio between [$Cl_2$] and [$BCl_3$] in the main etch step (=5:1). Therefore, the passivation film formed by the breakthrough step is heavier than the passivation film formed by the main etch step. All these facts imply that the ER of the breakthrough step is slower than the ER of the main etch step.

Figure 4:
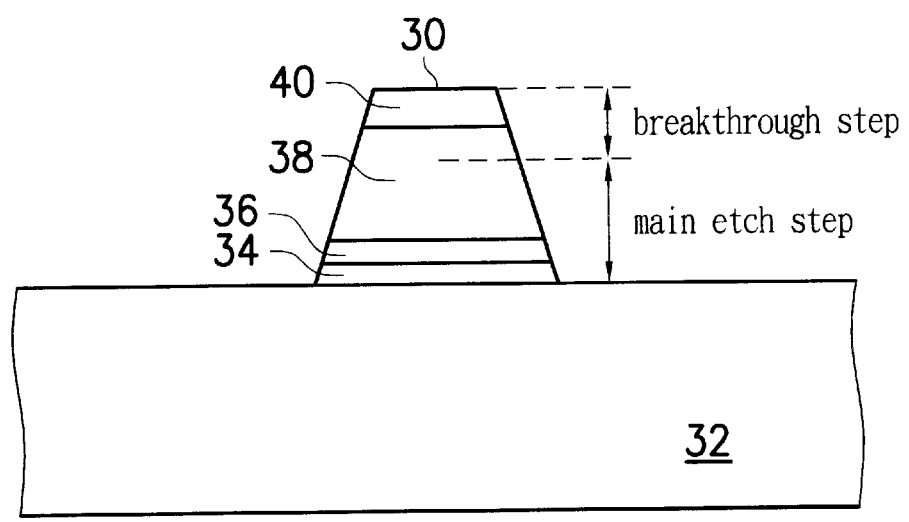
FIG. 4 illustrates the profile of a metal line generated by the method of the present invention.

FIG. 4 illustrates the profile of a metal line etched by the "two-step" method of the present invention, which proves to be a satisfactory result. The profile of the metal layer 30 shown in FIG. 4 is smooth (i.e., no overhang and bowing) and without "discontinuity" around the interface of the anti-reflection layer (TiN) 40 and the aluminum-alloy layer (AlSiCu) 38. Because of sufficient sidewall passivation with N2, the metal profiles are tapered. From the experimental results, the profiles are measured at tapering angles of approximately 83°–86° in dense area and 76°–78° in open area.

Figure 5:
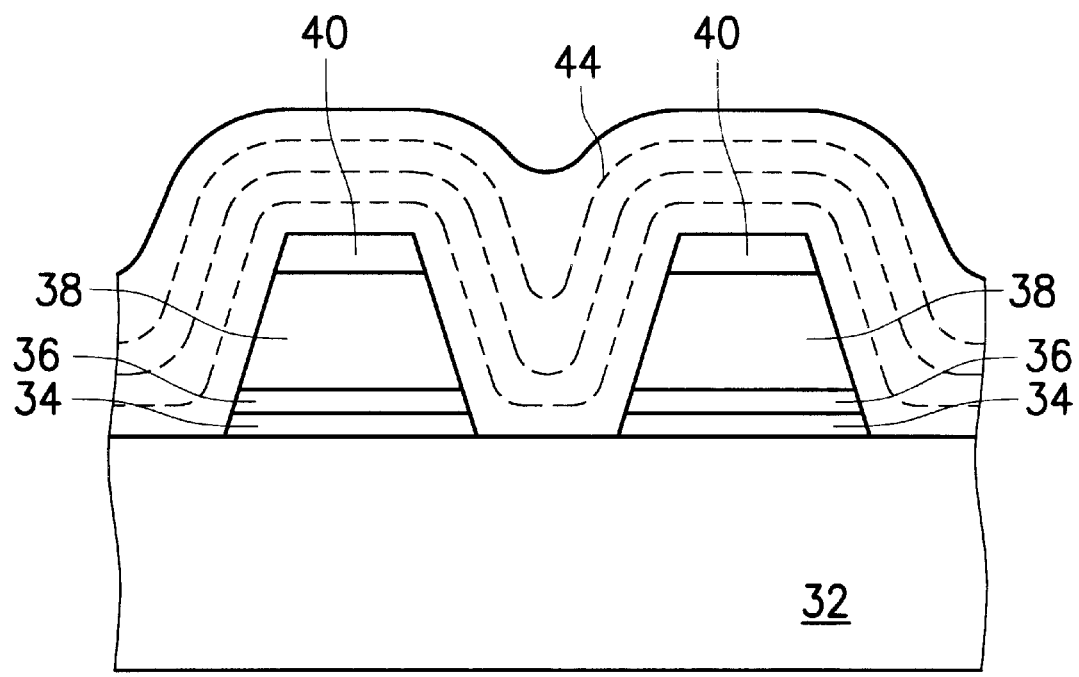
FIG. 5 illustrates the semiconductor wafer in FIG. 4 with a SACVD film deposited thereon.

FIG. 5 illustrates the wafer in FIG. 4 with a SACVD silicon-oxide film deposited thereon. For subsequent deposition processes, such as a semi-atmosphere chemical vapor deposition process for depositing a silicon-oxide layer 44, the wafer with metal lines formed according to the method of the present invention has a less probability of forming voids between the metal lines since the sidewalls of the metal lines are tapered and smooth, as shown in FIG. 5. In other words, the present invention can improve the reliability of the IC devices manufactured by the method of the present invention.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of profile control for etching a metal layer positioned on a dielectric layer, wherein the metal layer comprises at least:
    an aluminum-alloy layer on the dielectric layer;
    an anti-reflection layer on the aluminum-alloy layer;
    and wherein the method of profile control for etching a metal layer comprises the steps of:
        performing a breakthrough step of a first etch recipe to remove the anti-reflection layer and a certain thickness of the aluminum-alloy layer until a predetermined depth is reached, wherein the first etch recipe provides a first source power, a first bias power, and a nitrogen gas as a reactive gas, and wherein the ratio between the first source power and the first bias power is about 1/3; and
        performing a main etch step of a second etch recipe having a higher etch rate than the first etch recipe to remove the remaining residue of the aluminum-alloy layer, wherein the second etch recipe provides a second source power, a second bias power, and a nitrogen gas as a reactive gas, and wherein the ratio between the second source power and the second bias power is about 10/3.

2. The method as claimed in claim 1, wherein the flow rate of the reactive gas of the first etch recipe is higher than 10 sccm.

3. A method of profile control for etching a metal layer positioned on a dielectric layer, wherein the metal layer comprises at least:

an aluminum-alloy layer on the dielectric layer;

an anti-reflection layer on the aluminum-alloy layer, and wherein the method of profile control for etching a metal layer comprises the steps of:

performing a breakthrough step of a first etch recipe to remove the anti-reflection layer and a certain thickness of the aluminum-alloy layer until a predetermined depth is reached, wherein the first etch recipe provides a first source power, a first bias power, and a nitrogen gas as a reactive gas, and wherein the ratio between the first source power and the first bias power is about 1/3; and performing a main etch step of a second etch recipe having a higher etch rate than the first etch recipe to remove the remaining residue of the aluminum-alloy layer, wherein the second etch recipe provides a second source power, a second bias power, and a nitrogen gas as a reactive gas, and wherein the ratio between the second source power and the second bias power is about 10/3, wherein the choices of the reactive gases for the first etch recipe further include chlorine gas and $BCl_3$.

4. The method as claimed in claim 3, wherein the ratio between the flow rate of the chlorine gas and the flow rate of the $BCl_3$ gas is about 1:1.

5. The method as claimed in claim 1, wherein the choices of reactive gases for the second etch recipe further include chlorine gas and $BCl_3$ gas.

6. The method as claimed in claim 5, wherein the ratio between the flow rate of the chlorine gas and the flow rate of the $BCl_3$ gas is about 5:1.

7. The method as claimed in claim 1, wherein the predetermined depth of the aluminum-alloy layer is about 1/3 of the total thickness of the aluminum-alloy layer.

8. The method as claimed in claim 1, wherein the metal layer further comprises:

a shielding layer under the aluminum-alloy layer; and an adhesion layer positioned between the shielding layer and the dielectric layer.

9. The method as claimed in claim 8, wherein the adhesion layer is comprised of Ti.

10. The method as claimed in claim 8, wherein the shielding layer is comprised of TiN.

11. The method as claimed in claim 1, wherein the aluminum-alloy is an alloy of aluminum, copper, and silicon.

12. The method as claimed in claim 1, wherein the anti-reflection layer is comprised of TiN.

13. The method as claimed in claim 1, wherein the first etch recipe provides a first source power, a first bias power, and a nitrogen gas as a reactive gas, and wherein the ratio between the first source power and the first bias power is about 1/3.

14. The method as claimed in claim 1, wherein the second etch recipe provides a second source power, a second bias power, and a nitrogen gas as a reactive gas, and wherein the ratio between the second source power and the second bias power is about 10/3.

15. A method of profile control for etching a metal layer positioned on a dielectric layer, wherein the metal layer comprises at least:

an aluminum-alloy layer on the dielectric;

an anti-reflection layer on the aluminum-alloy layer; and wherein the method of profile control for etching a metal layer comprises the steps of:

performing a breakthrough step of a first etch recipe to remove the anti-reflection layer and a certain thickness of the aluminum-alloy layer until a predetermined depth is reached; and performing a main etch step of second etch recipe having a higher etch rate that the first etch recipe to remove the remaining residue of the aluminum-alloy, wherein the choices of reactive gases for both the first etch recipe and the second etch recipe include nitrogen gas, chlorine gas, and $BCl_3$ gas.

16. The method as claimed in claim 15, wherein the flow rate of the nitrogen gas of the first etch recipe is higher than 10 sccm.

17. The method as claimed in claim 15, wherein the flow rate of the chlorine gas and the $BCl_3$ gas of the first etch recipe is about 1:1.

18. The method as claimed in claim 15, wherein the flow rate of the chlorine gas and the $BCl_3$ gas of the second etch recipe is about 5:1.

19. The method as claimed in claim 15, wherein the predetermined depth of the aluminum layer is about 1/3 of the total thickness of the aluminum layer.

* * * * *